(12) United States Patent
Beyly et al.

(10) Patent No.: US 12,209,889 B2
(45) Date of Patent: Jan. 28, 2025

(54) DEVICE AND METHOD FOR TOUCH SENSING

(71) Applicants: STMicroelectronics (Rousset) SAS, Rousset (FR); STMicroelectronics France, Montrouge (FR); STMicroelectronics (Grenoble 2) SAS, Grebnoble (FR)

(72) Inventors: Laurent Beyly, Chasné sur illet (FR); Olivier Richard, Saint-Sauveur (FR); Kenichi Oku, Grasse (FR)

(73) Assignees: STMICROELECTRONICS FRANCE, Montrouge (FR); STMicroelectronics (Grenoble 2) SAS, Grenoble (FR); STMicroelectronics (Rousset) SAS, Rousset (FR)

( * ) Notice: Subject to any disclaimer, the term of this patent is extended or adjusted under 35 U.S.C. 154(b) by 164 days.

(21) Appl. No.: 18/155,531

(22) Filed: Jan. 17, 2023

(65) Prior Publication Data

US 2023/0152126 A1    May 18, 2023

Related U.S. Application Data

(62) Division of application No. 17/171,726, filed on Feb. 9, 2021, now Pat. No. 11,604,082.

(30) Foreign Application Priority Data

Feb. 10, 2020   (FR) ...................... 2001298

(51) Int. Cl.
*G01D 5/24*     (2006.01)
*H03K 17/96*    (2006.01)

(52) U.S. Cl.
CPC ............ *G01D 5/24* (2013.01); *H03K 17/962* (2013.01); *H03K 2217/9607* (2013.01)

(58) Field of Classification Search
USPC ....... 324/658, 660–663, 674, 676, 679, 686; 345/173
See application file for complete search history.

(56) References Cited

U.S. PATENT DOCUMENTS

| | | | |
|---|---|---|---|
| 5,189,417 A | 2/1993 | Caldwell et al. | |
| 8,159,462 B1* | 4/2012 | Seguine | G06F 3/04182 345/173 |
| 8,692,565 B2 | 4/2014 | Togura | |
| 10,126,340 B2 | 11/2018 | Simmons | |
| 2006/0238233 A1 | 10/2006 | Kraus | |
| 2010/0328252 A1* | 12/2010 | Chang | G06F 3/044 345/174 |

(Continued)

FOREIGN PATENT DOCUMENTS

CN              102033166 A       4/2011

*Primary Examiner* — Vincent Q Nguyen

(74) *Attorney, Agent, or Firm* — Slater Matsil, LLP

(57) ABSTRACT

An embodiment of the present disclosure relates to a method of detection of a touch contact by a sensor including a first step of comparison of a voltage with a first voltage threshold; and a second step of comparison of the voltage with a second voltage threshold, the second step being implemented if the first voltage threshold has been reached within a duration shorter than a first duration threshold, the second voltage threshold being higher than the first voltage threshold.

18 Claims, 6 Drawing Sheets

(56) References Cited

U.S. PATENT DOCUMENTS

| | | | |
|---|---|---|---|
| 2011/0115527 A1* | 5/2011 | Quinones | H03K 17/18 |
| | | | 327/77 |
| 2011/0267287 A1 | 11/2011 | Bartling et al. | |
| 2011/0279131 A1 | 11/2011 | Kim et al. | |
| 2011/0304576 A1* | 12/2011 | Fasshauer | H03K 17/955 |
| | | | 345/174 |
| 2012/0286800 A1 | 11/2012 | Maharyta et al. | |
| 2014/0354582 A1 | 12/2014 | Horne et al. | |
| 2016/0262232 A1 | 9/2016 | Fukui et al. | |
| 2018/0004349 A1 | 1/2018 | Gicquel et al. | |
| 2018/0157355 A1 | 6/2018 | Kim | |
| 2020/0210016 A1 | 7/2020 | Jonsson et al. | |

\* cited by examiner

DEVICE AND METHOD FOR TOUCH SENSING

CROSS-REFERENCE TO RELATED APPLICATIONS

This application is a divisional of U.S. patent application Ser. No. 17/171,726, filed Feb. 9, 2021, which application claims the benefit of French Patent Application No. 2001298 filed on Feb. 10, 2020, which applications are hereby incorporated herein by reference.

TECHNICAL FIELD

The present disclosure generally concerns electronic devices and methods, and more particularly devices comprising a touch sensor and associated methods.

BACKGROUND

Many touch sensors are known. One of the advantages of touch sensors is that they enable to have a device leave a low-power operating mode when a contact is established.

SUMMARY

An embodiment provides a method of detection of a touch contact by a sensor, comprising: a first step of comparison of a voltage with a first voltage threshold; and a second step of comparison of the voltage with a second voltage threshold, the second step being implemented if the first voltage threshold has been reached within a duration shorter than first duration threshold, the second voltage threshold being higher than the first voltage threshold.

According to an embodiment, the voltage is the voltage across a capacitor.

According to an embodiment, during each comparison step, the capacitor is charged by the repeating of the steps of: charging a touch region; and discharging the region into the capacitor.

According to an embodiment, the sensor comprises a plurality of touch regions.

According to an embodiment, a touch contact is detected when the first comparison step and the second comparison step are carried out and the second voltage threshold has been reached within a duration shorter than a second duration threshold.

According to an embodiment, the method comprises at least a third step, preferably two third steps, of comparison of the voltage with the second voltage threshold, if the second voltage threshold has been reached, during the previous step, within a duration shorter than a second duration threshold.

According to an embodiment, a touch contact is detected when the first comparison step, the second comparison step, and the at least one third comparison step are carried out and the second voltage threshold has been reached, during the last third comparison, within a duration shorter than the second duration threshold.

According to an embodiment, at least one of the voltage thresholds is supplied by a digital-to-analog converter.

According to an embodiment, at least one of the voltage thresholds is the threshold of a Schmitt trigger.

According to an embodiment, each comparison step is followed by the discharge of the capacitor.

Another embodiment provides an operating method of an electronic device, wherein the previously-described touch contact detection method is carried out during a low-power operating mode.

According to an embodiment, the detection of a touch contact causes the leaving of the low-power operating mode.

According to an embodiment, the touch contact detection method is regularly implemented during the low-power operating mode.

Another embodiment provides a touch sensor comprising a comparison circuit configured to compare a voltage with first and second voltage thresholds.

According to an embodiment, the sensor comprises a capacitor, the voltage across the capacitor being the voltage compared by the comparison circuit.

According to an embodiment, the sensor comprises a contact region configured to be charged and to be discharged into the capacitor.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
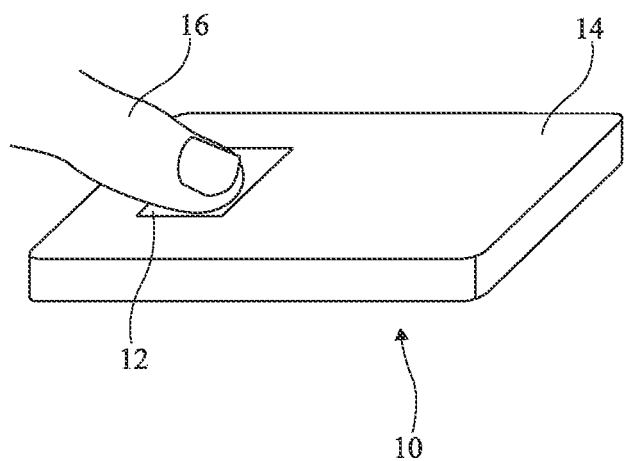
FIG. 1 shows an example of an electronic device of the type for which the embodiments described in relation with FIGS. 3 to 5 are intended.

FIG. 1 shows an example of an electronic device 10 of the type for which the embodiments described hereinafter in relation with FIGS. 2 to 5 are intended.

Device 10 comprises a touch sensor, that is, a circuit configured to detect the contact of a portion of a body, for example, a human body, for example, the contact of a finger 16, with a region 12, located in a package 14.

Device 10 is for example a wireless device, for example, a device powered by a battery or a cell. Further, device 10 is for example a device capable of being inactive for long periods. Device 10 is for example a remote control or a switch. Device 10 is for example a wireless headphone.

Region 12 for example corresponds to a button, having its activation, that is, its contact with finger 16, causing the activation of one or a plurality of functionalities of device 10 and/or the leaving of a low-power operating mode.

The power consumption of device 10 is often a significant criterion in the design of device 10. Thus, during idle periods, device 10 enters the so-called low-power operating mode. In such an operating mode, for example, standby, certain components and circuits of device 10 are not operating and are not powered, to keep energy.

During low-power operating periods, the circuit of detection of the contact with region 12 is generally maintained active. Thus, the detection of a contact between finger 16 and region 12 is generally used as a signal commanding the leaving of the low-power operating mode.

Figure 2:
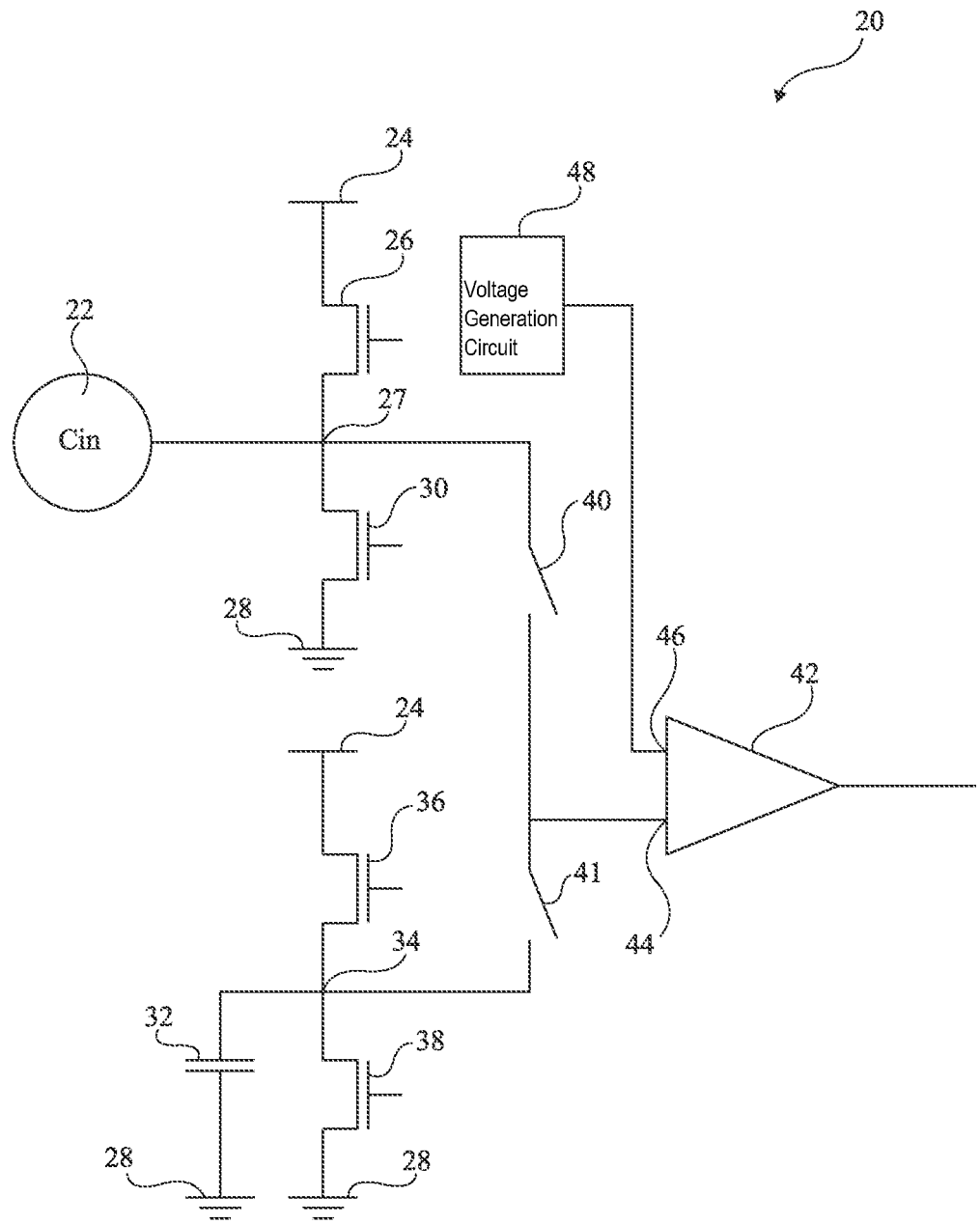
FIG. 2 shows an embodiment of a touch sensor.

FIG. 2 shows an embodiment of a touch sensor 20.

Sensor 20 comprises a contact region 22. Contact region 22 for example corresponds to the region 12 of FIG. 1. Sensor 20 is thus configured to detect a physical contact between a user's finger and region 22, for example, a user's finger and region 22.

Region 22 for example corresponds to a conductive layer, or pellet, covered with an insulating layer. Region 22 is preferably a metal pellet, for example, made of copper, covered with an electric insulator, for example, glass. Region 22 is, due to its forming, a portion of a capacitor Cin having a relatively low capacitance value, however sufficiently high to store charges. More particularly, the conductive pellet corresponds to a first electrode of capacitor Cin. When the user comes into contact, preferably by his/her finger, with region 22, the user's part in contact with region 22 forms the second electrode of capacitor Cin. Capacitor Cin is thus formed by the assembly comprising region 22 and the user, the capacitance value of capacitor Cin then being greater than the capacitance value of capacitor Cin in the absence of a contact. Thus, the value of capacitance Cin increases when there is a contact with region 22 and the user. In other words, the number of charges capable of being stored in capacitor Cin increases when a user touches region 22. Hereinafter, region 22, be it in or not in contact with the user, may be called "capacitor 22".

Region 22 is coupled to a node 24 of application of a power supply voltage of sensor 20 via a switch 26. Preferably, switch 26 is formed by one or a plurality of transistors. More particularly, the region is coupled, preferably connected, to a node 27. Transistor 26 is coupled, preferably connected, to node 27 by one of its conduction terminals and to node 24 by its other conduction terminal.

Further, region 22 is coupled to a node 28 of application of a reference voltage of sensor 20, preferably the ground, via a switch 30. Preferably, switch 30 is formed by one or a plurality of transistors. Transistor 30 is coupled, preferably connected, to node 27 by one of its conduction terminals and to node 28 by its other conduction terminal.

Thus, capacitor Cin may be charged with the power supply voltage via switch 26, switches 26 and 30 being respectively turned on and off during the charge. Similarly, capacitor Cin may be discharged onto node 28 via switch 30, switches 26 and 30 being respectively turned off and on during the discharge. In other words, the charges of capacitor Cin are transferred to node 28 via switch 30.

Sensor 20 further comprises a capacitive element 32, for example, a capacitor. The capacitance of element 32 is greater than the capacitance of capacitor Cin in the presence of a contact with the user. Preferably, the capacitance of element 32 is equal to at least 1,000 times the maximum capacitance of capacitor Cin, for example, from 1,000 to 10,000 times the maximum capacitance of capacitor Cin. The capacitance of capacitor Cin is for example in the order of a few picofarads, for example, substantially equal to 1 pF.

Capacitive element 32 is coupled, preferably connected, to node 28 by one of its terminals, and to a node 34 by another one of its terminals.

Node 34 is coupled to node 24 via a switch 36. Preferably, switch 36 is formed by one or a plurality of transistors. More precisely, transistor 36 is coupled, preferably connected, to node 34 by one of its conduction terminals and to node 24 by its other conduction terminal.

Further, node 34 is coupled to node 28 via a switch 38. Preferably, switch 38 is formed by one or a plurality of transistors. Transistor 38 is coupled, preferably connected, to node 34 by one of its conduction terminals and to node 28 by its other conduction terminal.

Sensor 20 further comprises a switch 40. Switch 40 is coupled to node 27 by one of its terminals and to node 34 by its other terminal.

According to an embodiment, sensor 20 may also comprise a switch 41. Switch 40 is coupled, preferably connected, to node 27 by one of its terminals and to node 34 by its other terminal. Switches 40 and 41 are for example controlled in the same way. In other words, switches 40 and 41 are for example turned off and turned on at the same times. As a variation, switch 41 may be maintained on during the sensor operation.

Sensor 20 further comprises a comparator 42. Comparator 42 receives at an input 44 the voltage of node 34. Node 34 is thus coupled, preferably connected, to input 44. Another input 46 is coupled, preferably connected, to a reference voltage generation circuit 48. The comparator thus compares the voltage on node 34 with a reference voltage delivered by circuit 48.

Circuit 48 is configured to deliver first (S1) and second (S2) reference voltages, or voltage thresholds, of different values, the value of the first voltage being smaller than the value of the second voltage. The value of the first voltage is for example in the range from 50% to 95% of the value of the second voltage, preferably from 75% to 95% of the value of the second voltage, preferably equal to approximately 90% of the value of the second voltage. The value of the first voltage threshold is for example substantially equal to the value of the power supply voltage applied to node 24 divided by 4 and the value of the second voltage threshold is for example, equal to the value of the power supply voltage applied to node 24 divided by 2.

For example, circuit 48 comprises a digital-to-analog converter, configured to deliver a voltage of variable value. For example, circuit 48 may deliver a finite number of fixed voltages.

According to an embodiment, sensor 20 may comprise a plurality of capacitors Cin, that is, a plurality of distinct regions having their contact with a user capable of being detected by sensor 20. Each region 22 is coupled, like the region 22 shown in FIG. 2, to input 44 by a switch 40. In other words, input 44 is coupled to a plurality of regions 22. Further, each region 22 is coupled to nodes 24 and 28 by switches 26 and 30, as shown in FIG. 2. In other words, according to an embodiment, sensor 20 comprises a plurality of regions 22 and as many switches 26, switches 30, and switches 40 as regions 22. Preferably, sensor 20 implements an operating method which will be described in relation with FIG. 3 for the different regions 22 one after the others. In this case, switch 41 is for example maintained on.

Figure 3:
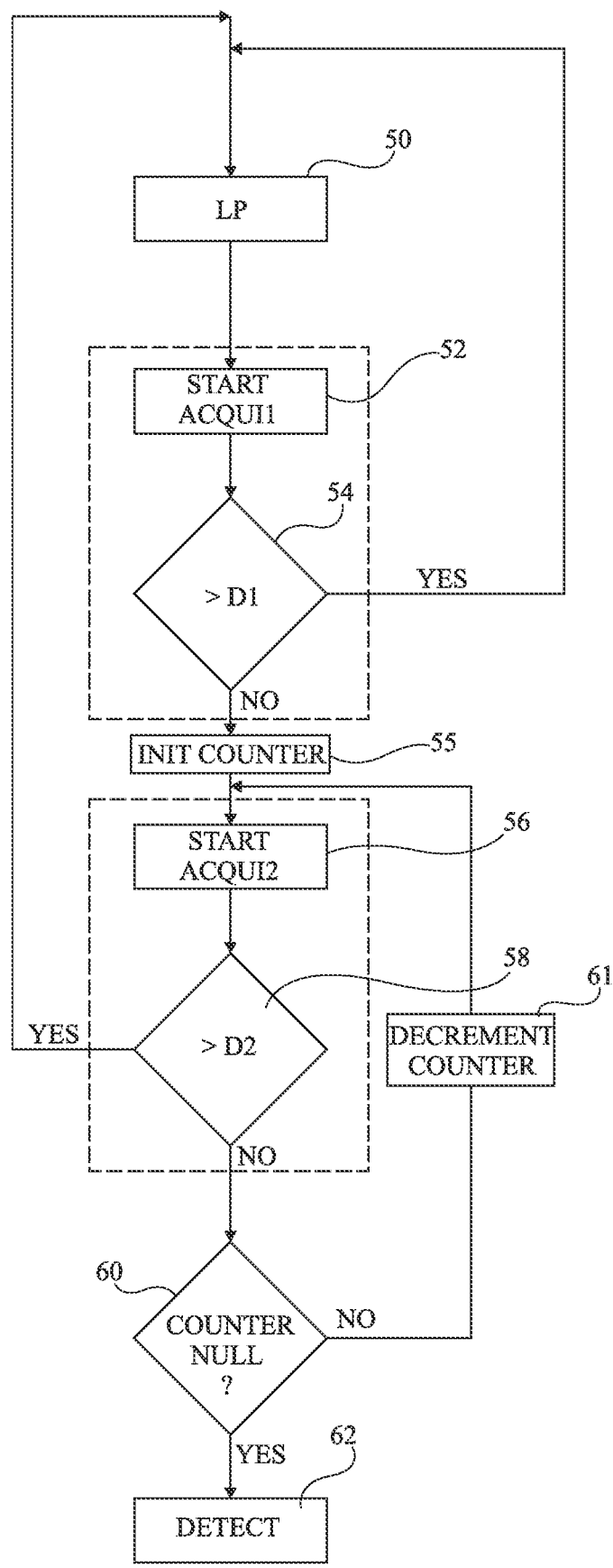
FIG. 3 shows an embodiment of an operating method of the device of FIG. 2.

FIG. 3 shows an embodiment of an operating method of the device of FIG. 2.

Sensor or device 20 is considered as being in a low-power operating mode (block 50—LP). During the low-power operating mode, the touch sensor regularly verifies whether there is a touch contact between the device and a user.

Thus, during the low-power mode, the sensor starts a first acquisition (block 52—START ACQUI1). At the beginning of the acquisition, capacitor 32 is preferably set to a reference charge level, preferably fully discharged. In other words, the charges contained by capacitor 32 are preferably all transferred to node 28, that is, to ground. Preferably, capacitor 22 is also set to a reference charge level, preferably fully discharged. During this acquisition, capacitor 22 (FIG. 2) is fully charged, and is then discharged into capacitor 32. The steps of charge and discharge of capacitor 22 are repeated until capacitor 32 is fully charged.

During a first phase of the acquisition, capacitors 22 and 32 are discharged. In this example, switches 26 and 36 are off. Further, switch 40 and switch 41 are on. Switch 30 and/or switch 38 is turned on, to be able to discharge capacitors 22 and 32 into node 28.

During a second phase of the acquisition, switch 40 is maintained off, to be able to modify the charge levels of capacitors 22 and 32 independently from each other. During the second phase of the acquisition, switch 26 is then turned on and switches 30, 36, 38, and 40 are turned off. Thus, capacitor 22 is fully charged by node 24.

During a third phase of the acquisition, capacitor 22 is discharged into capacitor 32. For this purpose, switch 40 is turned on. Further, switches 26, 30, 36, and 38 are turned off.

The different phases of the acquisition may be separated by idle periods, during which switches 26, 30, 36, 38, and 40 are all off. Such idle periods preferably have a duration shorter than a few hundreds of nanoseconds, for example, shorter than 50 ns.

Other off and on configurations of the different switches may of course be implemented to carry out the three distinct phases of the acquisition, that is, the discharge of capacitors 22 and 32, the charge of capacitor 22, and the discharge of capacitor 22 into capacitor 32. For example, during the first phase, capacitors 22 and 32 may be discharged successively rather than simultaneously. For example, during the first phase, switch 40 may be off during the discharge, switches 30 and 38 then being both on.

The second and third phases of the acquisition are repeated to charge capacitor 32 until a voltage V32 across capacitor 32 reaches the value of first reference voltage S1.

During the repeating of the second and third phases of the acquisition, voltage V32 is compared, by comparator 42, with the first reference voltage S1 delivered by circuit 48.

When voltage V32 reaches the value of first reference voltage S1, the sensor determines the duration D of the charge of capacitor 32. For example, the sensor determines the duration D between the beginning of the second initial phase and the time at which voltage V32 reaches value S1.

Duration D is then compared with a threshold value of duration D1 (block 54→D1). Capacitor Cin has, when a user is in contact with region 22, a value greater than in the case where region 22 is not in contact with the user. Thus, the charge of capacitor 32 is achieved within a smaller number of repetitions of the second and third phases when a user is in contact with region 22 than in the case where region 22 is not in contact with the user. Duration D thus has a smaller value when a user is in contact with region 22 than in the case where region 22 is not in contact with the user.

Threshold value D1 is selected so that a value D greater than value D1 means that there is no touch contact and a value D smaller than value D1 suggests a touch contact.

If value D is greater than value D1 (branch YES, block 54), the device remains in low-power operating mode (block 50). The method, and thus the acquisition, are carried out periodically during the low-power operating mode. Thus, the step represented by block 52 is carried out again after a predetermined period, for example, in the range from 200 to 300 ms, for example, substantially equal to 230 ms.

If value D is smaller than value D1 (branch NO, block 54), the sensor initializes a counter, for example, by assigning value 2 to a variable i (block 55, INIT COUNTER) and starts a second acquisition (block 56, START ACQUI2). Further, the voltage value on input 46 of the comparator is changed by circuit 48 to be equal to the value of second reference voltage S2.

During the second acquisition, the three acquisition phases are for example carried out as described in relation with the first acquisition. More particularly, the second acquisition comprises a first phase during which capacitors 22 and 32 are discharged. The second acquisition further comprises second and third phases, repeated until voltage V32 across capacitor 32 is equal to the value of second reference voltage S2. As previously, the second phase corresponds to the charge, preferably complete, of capacitor 22 and the third phase corresponds to the discharge, preferably complete, of capacitor 22 into capacitor 32.

The turning-on and the turning-off of the different switches are for example such as described in relation with the first acquisition.

When voltage V32 reaches the value of second reference voltage S2, the sensor determines a duration D' of the charge of capacitor 32. For example, the sensor determines the duration D' between the beginning of the second initial phase of the second acquisition and the time at which voltage V32 reaches value S2.

Duration D' is then compared with a threshold value D2 (block 58→D2). Capacitor Cin has, when a user is in contact with region 22, a value greater than in the case where region 22 is not in contact with the user. Thus, the charge of capacitor 32 is performed within a smaller number of repetitions of the second and third phases when a user is in contact with region 22 than in the case where region 22 is not in contact with the user. Duration D' thus has a smaller value when a user is in contact with region 22 than in the case where region 22 is not in contact with the user.

Threshold value D2 is selected so that a value D' greater than value D2 means that there is no touch contact and a value D' smaller than value D2 suggests a touch contact.

If value D' is greater than value D2 (branch YES, block 58), the device remains in low-power operating mode (block 50).

If value D' is smaller than value D2 (branch NO, block 58), this suggests a touch contact at the level of region 22. Preferably, the second acquisition is carried out a plurality of times, preferably three times, to ascertain that the detection is correct and that it is not a false measurement, in other words, a false positive. The value assigned to variable i during the use of the counter is equal to the desired number of acquisitions minus 1. For this purpose, the value of variable i of the counter is compared with the desired number of successive second acquisitions, here three acquisitions (block 60, COUNTER NULL?).

If variable i has a value greater than zero (branch NO, block 60), that is, if less than three second acquisitions have been carried out, the value of the variable is decremented by one unit, for example, by a value '1' (block 61, DECREMENT COUNTER) and a new second acquisition is implemented.

If variable i has a value equal to zero (branch YES, block 60), this means that, for the three successive second acquisitions, duration D' is shorter than threshold value D2. The sensor thus considers that there effectively is a touch contact at the level of region 22 (block 62—DETECT). Preferably, the device then leaves the low-power operating mode and elements of the device may then be turned back on.

If, during one of the second acquisitions, value D' is greater than threshold value D2, the touch contact detection step is over until the next iteration of the first acquisition.

Figure 5:
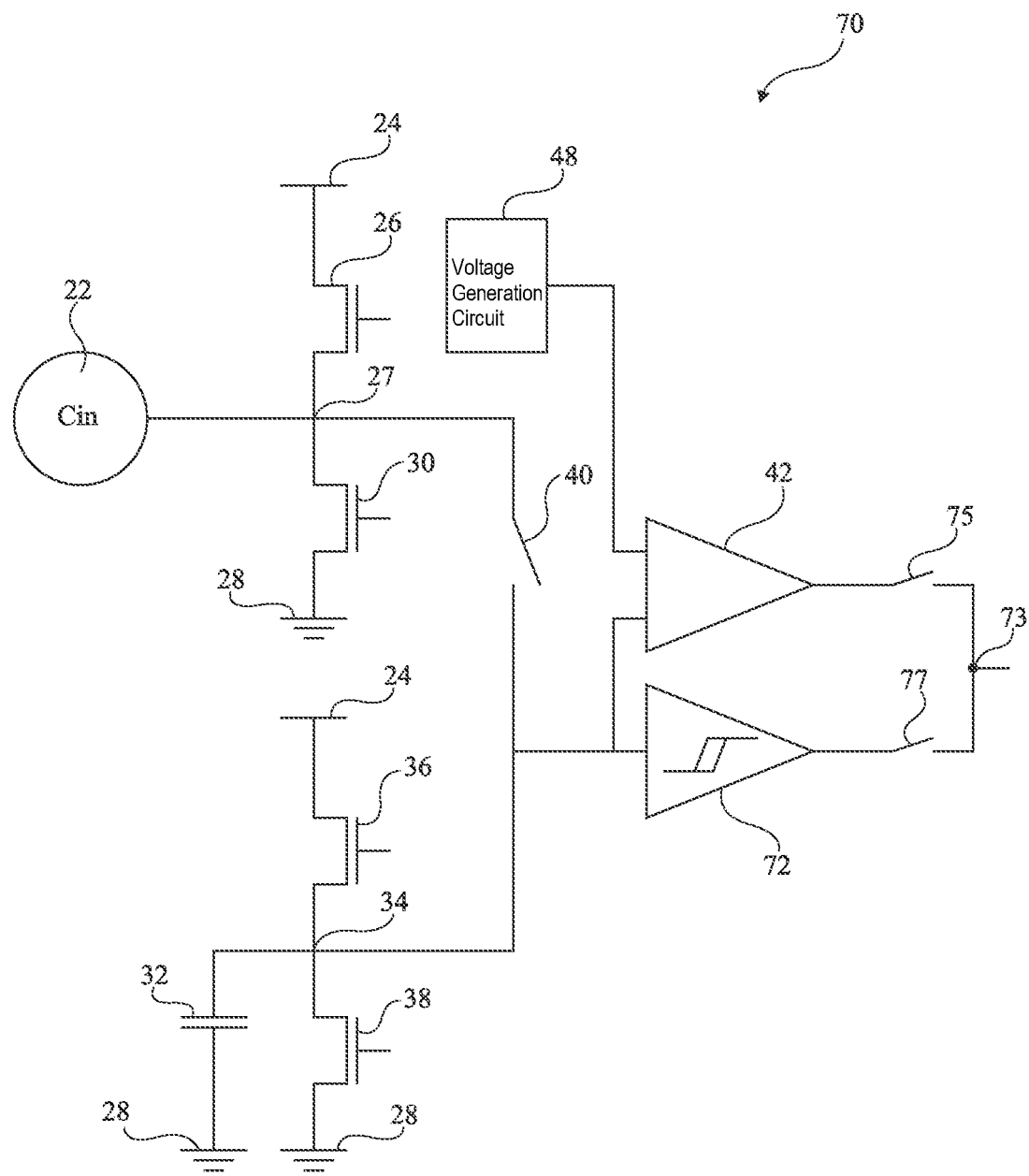
FIG. 5 shows another embodiment of a touch sensor.
Figure 6:
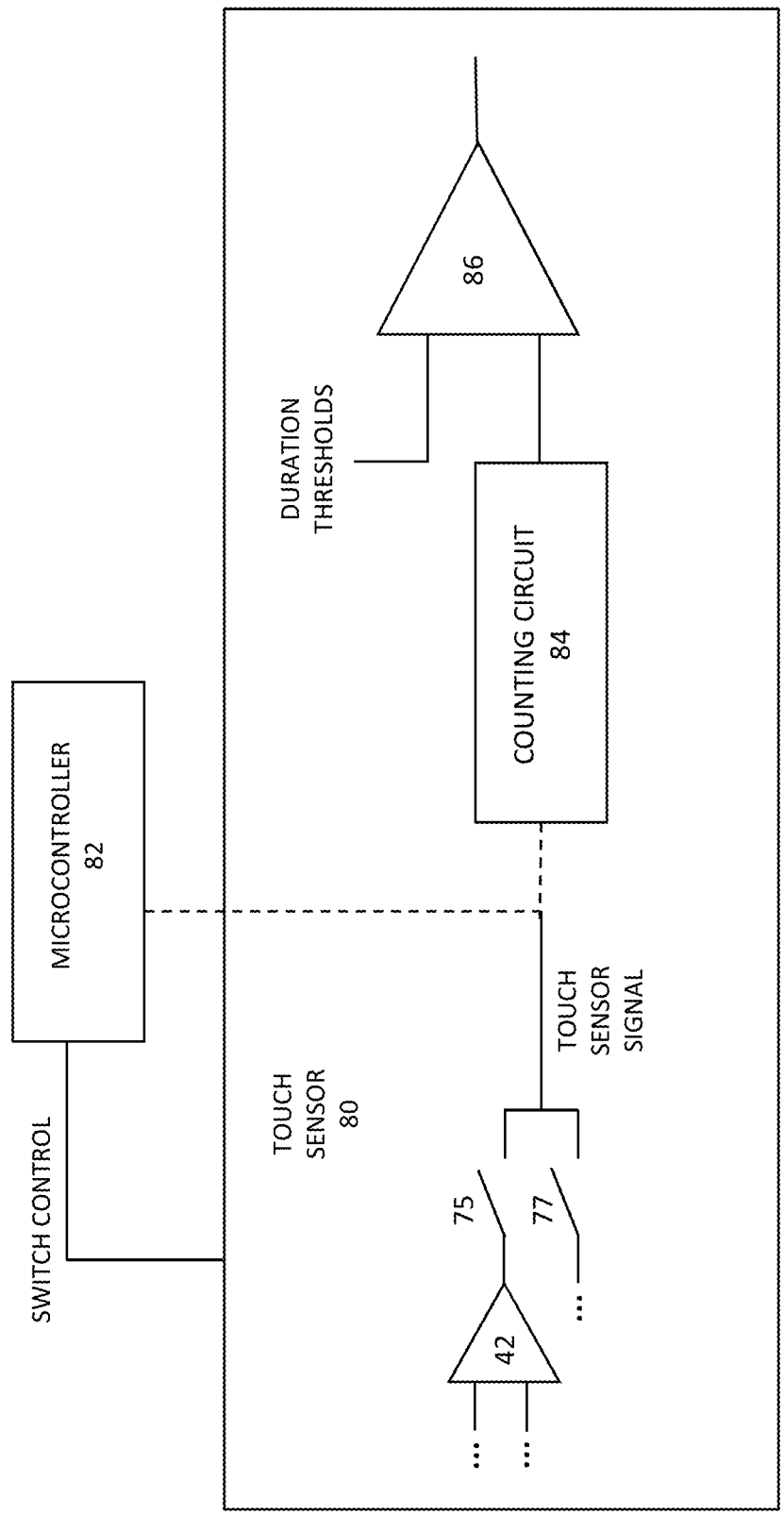
FIG. 6 shows an embodiment having a counting circuit and comparator, or alternatively a microprocessor.

The determination of the different durations D and D' and the comparison of durations D, D' with threshold values D1 and D2 may for example be performed digitally, for example, by software provided for this purpose. For this purpose, as shown in FIG. 6, the device for example comprises touch sensor 80 having comparator 42 providing a touch sensor signal to a microcontroller 82 configured to carry out these operations. Otherwise, as shown alternatively in FIG. 6, such operations may be performed analogically, the sensor 80 for example comprising a counting circuit 84 to determine durations D and D' and a comparator 86 to compare the durations with threshold values D1 and D2. The touch sensor signal may be provided directly by an output of comparator 42 as shown in FIG. 2, or by switches 75, 77 as shown in FIG. 5.

Similarly, the control signals of switches 26, 30, 36, 38, and 40 may be determined digitally, for example, by software provided for this purpose, for example, by the microcontroller 82, or in analog fashion.

Figure 4:
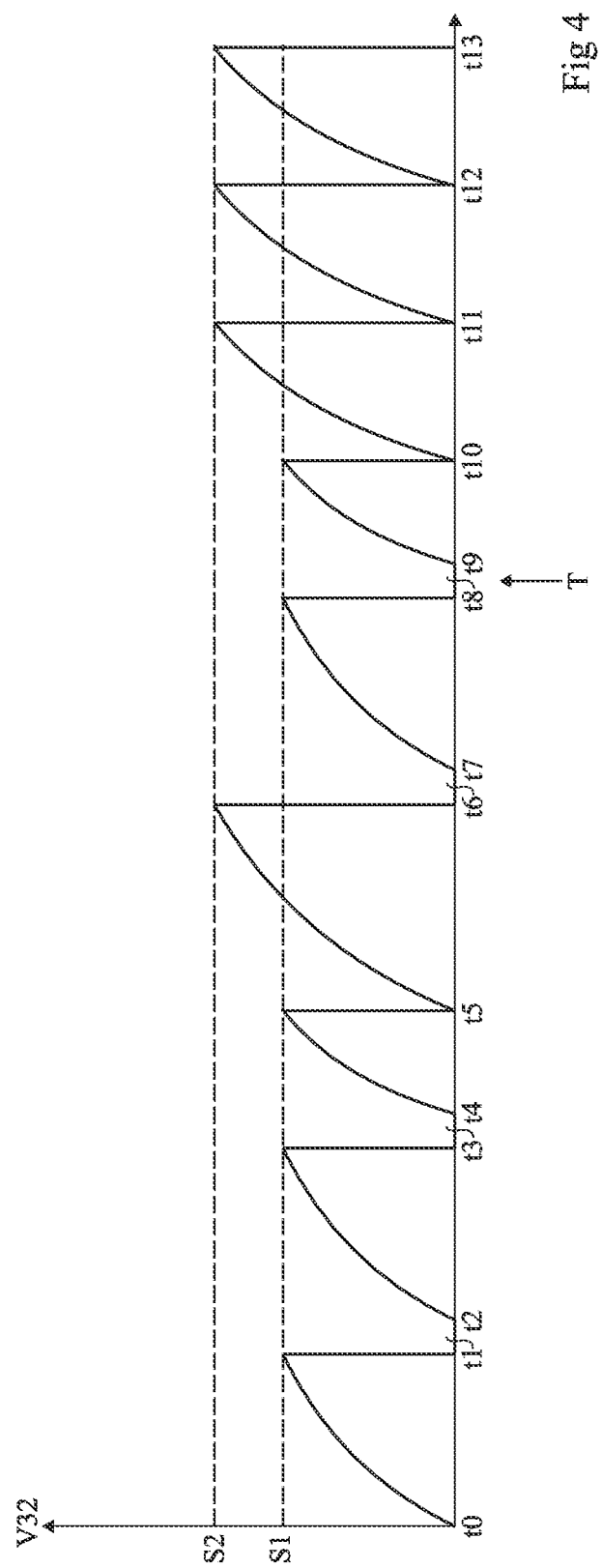
FIG. 4 shows an example of variations of a voltage of the device of FIG. 1.

FIG. 4 shows an example of variations of a voltage of the device 20 of FIG. 1 over time. More particularly, FIG. 4 shows an example of variations of voltage V32 across capacitor 32 (FIG. 2).

At the origin of the shown time range, that is, at a time to, the device is in the low-power operating mode. Further, there is no touch contact at the level of region 22. During the low-power operating mode, first acquisitions are periodically carried out.

At time to, sensor 20 starts a first acquisition (block 52, FIG. 3). Voltage V32 thus increases along the charge of capacitor 32 via capacitor 22. At a time t1 subsequent to time to, comparator 42 determines that voltage V32 has reached value S1. Duration D, here equal to the difference between t1 and t0, is compared with threshold value D1 and the sensor determines that, in the present example, duration D is longer than threshold value D1.

No touch contact is thus detected and the device thus remains in the low-power operating mode.

At a time t2, subsequent to time t1, sensor 20 starts another first acquisition. Voltage V32 thus increases along the charge of capacitor 32. At a time t3 subsequent to time t2, comparator 42 determines that voltage V32 has reached value S1. Duration D, here equal to the difference between t3 and t2, is compared with threshold value D1 and the sensor determines that, in the present example, duration D is greater than threshold value D1.

No touch contact is thus detected and the device thus remains in the low-power operating mode.

At a time t4, subsequent to time t3, another first acquisition is started by the sensor. Voltage V32 thus increases along the charge of capacitor 32. At a time t5 subsequent to time t4, comparator 42 determines that voltage V32 has reached value S1. Duration D, here equal to the difference between t5 and t4, is compared with threshold value D1 and the sensor determines that, in the present example, duration D is shorter than threshold value D1. Such a result suggests that there has been a touch contact at the level of region 22. In the example of FIG. 4, it is a false positive. Indeed, there has been no touch contact. Such a false positive is at least partially due to value S1, which is relatively low and thus likely to be reached relatively fast, even when there has been no touch contact. Indeed, the sensitivity of the sensor when the threshold is threshold S1 is relatively high, higher than when the threshold is threshold S2.

At time t5, after duration D has been compared with the threshold value and the result of this comparison has suggested the presence of a contact, a second acquisition (block 56, FIG. 3) is started by the sensor.

During the second acquisition, capacitor 22 is charged and discharged into capacitor 32, during second and third phases, to reach value S2. In the present example, the comparator determines that value S2 has been reached at a time t6. Duration D', here equal to the difference between t6 and t5, is compared with threshold value D2 and the sensor determines that, in the present example, duration D' is longer than threshold value D2. Thus, although the value of duration D of the first acquisition, between times t4 and t5, suggests that there is a touch contact at the level of region 22, the value of duration D' indicates that this is not true. Value S2 is higher, and thus the determination is less sensitive and more accurate. The sensor thus remains in low-power operating mode.

Another first acquisition is carried out between times ty and t8 subsequent to time t6. The duration D of this acquisition implies that there is no touch contact at the level of region 22.

At a time T subsequent to time t8, a touch contact is performed. For example, a user's finger comes into contact with region 22. The finger remains in contact with region 22 for all the times of FIG. 4 subsequent to time T.

At a time t9, subsequent to time T, a first acquisition is implemented. Voltage V32 reaches value S1 at a time t10. The value of duration D, here equal to the difference between time t10 and time t9, is smaller than the value of threshold D1, which suggests that there is a touch contact at the level of region 22.

At time t10, a second acquisition is implemented. The value of voltage V32 reaches threshold S2 at a time t11, subsequent to time t10. Duration D', equal during this acquisition to the difference between time t11 and time t10, is shorter than threshold D2.

At time t11, another second acquisition is implemented. The value of voltage V32 reaches threshold S2 at a time t12, subsequent to time t11. Duration D', equal during this acquisition to the difference between time t12 and time t11, is shorter than threshold D2.

At time t12, a second acquisition is implemented. The value of voltage V32 reaches threshold S2 at a time t13, subsequent to time t12. Duration D', equal during this acquisition to the difference between time t13 and time t12, is shorter than threshold D2.

To confirm the detection of the touch contact, three second acquisitions are successively carried out. The sensor considers that the touch contact is confirmed when the durations D' of the third second acquisitions are shorter than threshold D2. If the duration D' of one of the three acquisitions is longer than threshold D2, the sensor considers that there is no contact and the device remains in low-power operating mode. The succession of second acquisitions stops when the duration D' of one of the three second acquisitions is longer than threshold D2. For example, if the second one of the three successive second acquisitions has a duration D' greater than value D2, the last acquisition is not carried out.

More generally, the number of successive second acquisitions may be different. At least one second acquisition is carried out, preferably three second acquisitions. The larger the number of second acquisitions, the more certain the contact detection. However, the increase of the number of second acquisitions also causes an increase of the energy cost of the detection, and of the duration of the detection. The smaller the number of second acquisitions, the less the detection is power consuming and the less time is taken by the detection. However, the smaller the number of second acquisitions, the less certain the result. Thus, decreasing the number of second acquisitions increases the risk of having a false positive, that is, of detection of a contact while there is no contact.

In the example of FIG. 4, capacitor 32 is discharged after each acquisition. The value of voltage V32 thus recovers a low value at times t1, t3, t5, t6, t8, t10, t11, t12, and t13. The low value corresponds to a reference value, preferably the value of the voltage on node 28, preferably equal to 0 V.

Although the duration between times t1 and t2, between times t3 and t4, between times t6 and t7, and between times t8 and t9, is shown as being shorter than the duration of one of the acquisitions, such durations between these times are preferably substantially equal to one another. Further, the durations between these times are preferably greater than ten times the duration of a first acquisition. The durations between these times are for example in the range from 200 to 300 ms, for example, substantially equal to 230 ms.

Although it is considered, in FIG. 4, that the second acquisitions start at the time at which the first or second previous acquisition ends, that is, at time t5, t10, t11, or t12, it is possible for them to be separated by a duration D1, not shown. Duration D1 for example corresponds to the duration of comparison of the duration value with threshold D1 or D2. Duration D1 is preferably shorter than 5 ms.

FIG. 5 shows another embodiment of a touch sensor 70. Sensor 70 comprises elements identical to the elements of the sensor 20 of FIG. 2, referenced in the same way. These elements will not be detailed again.

Sensor 70 differs from sensor 20 in that sensor 70 comprises a comparison circuit comprising comparator 42 and an additional comparison element 72. An input of element 72 is coupled, preferably connected, to node 34, and thus receives voltage V32.

An output of element 72 is coupled to an output node 73 of sensor 70 via a switch 77. Similarly, the output of comparator 42 is coupled to node 73 via a switch 75.

Comparison element 72 compares the voltage value at its input with a fixed threshold value, specific to the selected comparison element and to its characteristics. For example, element 72 is a Schmitt trigger.

In the example of FIG. 5, circuit 48 supplies a threshold value, for example, a single threshold value. Preferably, the threshold value supplied by circuit 48 is smaller than the fixed threshold of element 72. The threshold value supplied by circuit 48 is for example in the range from 75% to 95% of the value of the fixed threshold of element 72, preferably equal to approximately 90% of the value of the fixed threshold of element 72.

The operation of sensor 70 is similar to the operation of the sensor 20 described in relation with FIGS. 3 and 4. During first acquisitions, voltage V32 is compared with the threshold supplied by circuit 48 and with the threshold of element 72. Since the value of the threshold delivered by circuit 48 is smaller than the value of the threshold of element 72, voltage 34 first reaches this value. When the value supplied by circuit 48 has been reached, the first acquisition is finished. Further, during the first acquisition, switch 75 is on and switch 77 is off.

During second acquisitions, switch 75 is turned off and switch 77 is turned on. Thus, the comparison of element 42 has no further effect and only the comparison with the threshold of comparator 72 has an impact on the sensor. As a variation, during the second acquisitions, comparator 42 may be configured:
 to receive from circuit 48 a value greater than the threshold value of element 72; or
 not to compare the voltage on node 34 with a reference voltage. For example, comparator 42 may be deactivated.

Thus, each second acquisition ends when the voltage on node 34 reaches the threshold value of element 72.

As in the case of sensor 20, a touch contact is detected when a first acquisition and at least one second acquisition, preferably three second acquisitions, have been successively carried out, and when the duration D of the first acquisition and the duration D' of the at least one second acquisition are below thresholds, respectively D1 and D2.

Although the embodiments are described in the context of the leaving of a low-power operating mode, that is, the detection of a touch contact causes the leaving of the low-power mode, it should be understood that the detection of a contact may be used in other situations without modifying the described embodiments. For example, region 22 may form a button activating, when a touch contact is detected, one or a plurality of functionalities of device 10.

It could have been chosen to compare the voltage on node 34 with a single threshold value, for example, with a fixed threshold of a Schmitt trigger. Thus, in low-power operating mode, acquisitions would be performed regularly. During each of the acquisitions, capacitor 32 would be charged to reach the threshold value. However, the threshold value would then be relatively significant, for example, equal to the second threshold described in relation with FIG. 2, to avoid too large a number of false positives. Thus, acquisitions during the low-power operating mode would be more power consuming than the first acquisitions described in relation with FIGS. 2 and 5.

An advantage of the described embodiments thus is that the power consumption is decreased with respect to a sensor only comparing the voltage on node 34 with a single value, for example, equal to the value of the second threshold.

Another advantage of the embodiments is that the sensor is more accurate and has less risks of false positive than a sensor only comparing the voltage on node 34 with a single value, for example, equal to the value of the first threshold.

Various embodiments and variants have been described. Those skilled in the art will understand that certain features of these embodiments can be combined and other variants will readily occur to those skilled in the art.

Finally, the practical implementation of the described embodiments and variants is within the abilities of those skilled in the art based on the functional indications given hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A touch sensor comprising:
a contact capacitor comprising a contact region;
a first switch having a first conduction terminal coupled to a first electrode of the contact capacitor;
a reference capacitor having a first electrode coupled to a first power node;
a second switch having a first conduction terminal coupled to a second electrode of the reference capacitor, and a second conduction terminal coupled to a second conduction terminal of the first switch;
a third switch having a first conduction terminal coupled to a second power node, and a second conduction terminal coupled to the first conduction terminal of the first switch;
a fourth switch having a first conduction terminal coupled to the first conduction terminal of the first switch, and a second conduction terminal coupled to the first power node; and
a comparator configured to compare a contact voltage of the contact region with first and second voltage thresholds, the second voltage threshold being higher than the first voltage threshold.

2. The touch sensor according to claim 1, wherein the contact voltage is across the contact capacitor.

3. The touch sensor according to claim 2, wherein the contact region is configured to be charged and discharged into the contact capacitor.

4. The touch sensor according to claim 2, wherein the reference capacitor is switchably coupled to the comparator in parallel with the contact capacitor.

5. The touch sensor according to claim 1, further comprising a digital-to-analog converter coupled to the comparator and configured to generate the first and second voltage thresholds.

6. The touch sensor according to claim 1, further comprising a plurality of contact regions configured to be selectively coupled to the comparator.

7. The touch sensor according to claim 1, further comprising a Schmitt trigger providing the second voltage threshold.

8. An electronic device comprising:
a package; and
a touch sensor disposed in the package, the touch sensor comprising:
a contact capacitor having a contact region on an external surface of the package;
a first switch having a first conduction terminal coupled to a first electrode of the contact capacitor;
a reference capacitor having a first electrode coupled to a first power node;
a second switch having a first conduction terminal coupled to a second electrode of the reference capacitor, and a second conduction terminal coupled to a second conduction terminal of the first switch;
a third switch having a first conduction terminal coupled to a second power node, and a second conduction terminal coupled to the first conduction terminal of the first switch;
a fourth switch having a first conduction terminal coupled to the first conduction terminal of the first switch, and a second conduction terminal coupled to the first power node;
a comparator having a first input coupled to the second conduction terminals of the first and second switches, and a second input coupled to an output of a reference voltage generator; and
a touch sensor signal provided by an output of the comparator.

9. The electronic device of claim 8, further comprising:
a fifth switch having a first conduction terminal coupled to the second power node, and a second conduction terminal coupled to the first conduction terminal of the second switch; and
a sixth switch having a first conduction terminal coupled to the first conduction terminal of the second switch, and a second conduction terminal coupled to the first power node.

10. The electronic device of claim 9, wherein:
the third, fourth, fifth, and sixth switches are transistors;
the first power node is ground; and
the second power node is a power supply voltage.

11. The electronic device of claim 9, further comprising a microcontroller coupled to the touch sensor signal, and to control inputs of the first, second, third, fourth, fifth, and sixth switches.

12. The electronic device of claim 8, further comprising:
a counting circuit coupled to the touch sensor signal; and
a second comparator coupled to the counting circuit.

13. The electronic device of claim 8, wherein the reference voltage generator is a digital-to-analog converter.

14. An electronic device comprising:
a package; and
a touch sensor disposed in the package, the touch sensor comprising:
a contact capacitor having a contact region on an external surface of the package;
a first switch having a first conduction terminal coupled to a first electrode of the contact capacitor;
a reference capacitor having a first electrode coupled to a first power node, and a second electrode coupled to a second conduction terminal of the first switch;
a comparator having a first input coupled to the second conduction terminal of the first switch, and a second input coupled to an output of a reference voltage generator;
a second switch having a first conduction terminal coupled to an output of the comparator;
a Schmitt trigger having an input coupled to the second conduction terminal of the first switch;
a third switch having a first conduction terminal coupled to an output of the Schmitt trigger;
a fourth switch having a first conduction terminal coupled to a second power node, and a second conduction terminal coupled to the first conduction terminal of the first switch;
a fifth switch having a first conduction terminal coupled to the first conduction terminal of the first switch, and a second conduction terminal coupled to the first power node; and
a touch sensor signal provided by second conduction terminals of the second and third switches.

15. The electronic device of claim 14, further comprising:
a sixth switch having a first conduction terminal coupled to the second power node, and a second conduction terminal coupled to the first conduction terminal of the second switch; and
a seventh switch having a first conduction terminal coupled to the first conduction terminal of the second switch, and a second conduction terminal coupled to the first power node.

16. The electronic device of claim 15, wherein:
the fourth, fifth, sixth, and seventh switches are transistors;
the first power node is ground; and
the second power node is a power supply voltage.

17. The electronic device of claim 15, further comprising a microcontroller coupled to the touch sensor signal, and to control inputs of the first, second, third, fourth, fifth, sixth, and seventh switches.

18. The electronic device of claim 14, further comprising:
a counting circuit coupled to the touch sensor signal; and
a second comparator coupled to the counting circuit.

* * * * *